United States Patent [19]

Auerbach

[11] Patent Number: 4,796,019
[45] Date of Patent: * Jan. 3, 1989

[54] INPUT DEVICE FOR A DISPLAY SYSTEM

[75] Inventor: Victor Auerbach, Trenton, N.J.

[73] Assignee: RCA Licensing Corporation, Princeton, N.J.

[*] Notice: The portion of the term of this patent subsequent to May 17, 2005 has been disclaimed.

[21] Appl. No.: 16,805

[22] Filed: Feb. 19, 1987

[51] Int. Cl.$^4$ .............................................. G09G 1/00
[52] U.S. Cl. ................................... 340/709; 340/712; 340/706
[58] Field of Search ............... 340/709, 710, 706, 707, 340/708, 365 D, 870.25, 870.28, 870.29; 455/603; 356/5, 141, 142, 194.1; 178/18, 19, 17 D

[56] References Cited

U.S. PATENT DOCUMENTS

| | | | |
|---|---|---|---|
| 4,209,255 | 6/1980 | Heynau et al. | 356/152 |
| 4,313,227 | 1/1982 | Eder | 455/617 |
| 4,565,999 | 1/1986 | King et al. | 340/706 |
| 4,626,892 | 12/1986 | Nortrup | 358/21 |
| 4,641,205 | 2/1987 | Beyers, Jr. | 360/33.1 |
| 4,654,648 | 3/1987 | Herrington | 340/710 |

*Primary Examiner*—John W. Caldwell, Sr.
*Assistant Examiner*—Alvin Oberley
*Attorney, Agent, or Firm*—Paul J. Rasmussen; Peter M. Emanuel; Thomas F. Lenihan

[57] ABSTRACT

The invention relates to a display system using a remote control transmitter handunit having both a "pointing function" capability for moving a cursor displayed on a display screen by changing the angular position of the remote control handunit, and the capability of sending dedicated function data directly to the receiver. Thus, numeric data representing, for example, channel number or time of day, being unsuitable for selection from a menu is directly transmitted along with "pointing function" data transmission.

18 Claims, 8 Drawing Sheets

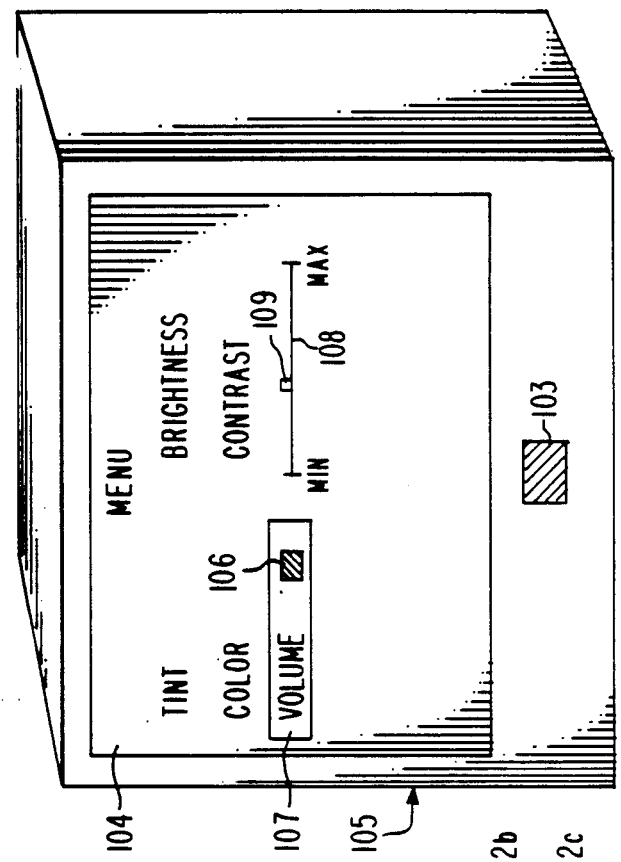
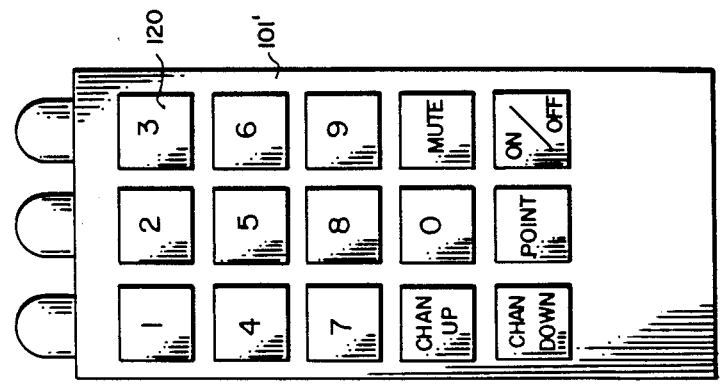
Fig. 1a
Fig. 1b

EXEMPLARY THREE-LED ARRAY FOR Y-AXIS MEASUREMENT

RECEIVED IR MODULATION COMPONENTS

BLOCK DIAGRAM OF REMOTE CONTROL HAND UNIT

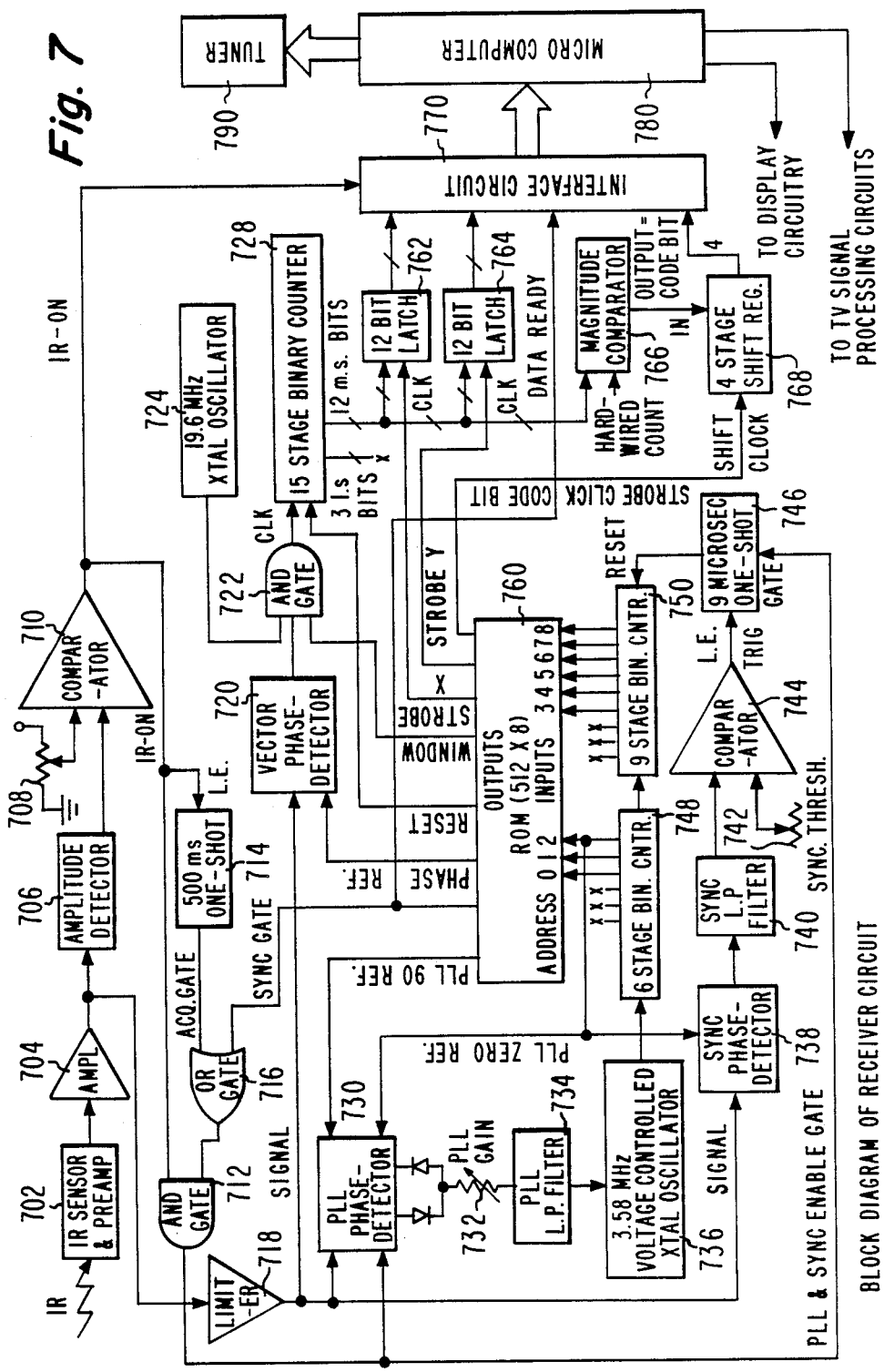

Transmitter ROM Contents, Sequence with 4 Data Bits

| SEQUENCE INTERVAL | ADDRESS LINES 8-7 6 5 4 3 2 1 0 11 | OUTPUTS TL 401 | TR 402 | BL 403 | BR 404 | L 405 | R 406 | T 407 | B 408 | LED POSITION LED NUMBER |
|---|---|---|---|---|---|---|---|---|---|---|
| Sync and Carrier Phase-Reference | X 0 0 0 0 0 X<br>X 0 0 0 0 1 0<br>X 0 0 0 0 1 1<br>X 0 0 0 1 0 0<br>X 0 0 0 1 0 1<br>X 0 0 0 1 1 X | zero<br>zero<br>180<br>180<br>zero<br>zero | zero<br>zero<br>180<br>180<br>zero<br>zero | zero<br>zero<br>180<br>180<br>zero<br>zero | zero<br>zero<br>180<br>180<br>zero<br>zero | zero<br>zero<br>180<br>180<br>zero<br>zero | zero<br>zero<br>180<br>180<br>zero<br>zero | zero<br>zero<br>180-<br>180<br>zero<br>zero | zero<br>zero<br>180<br>180<br>zero<br>zero | |
| Regular Y-sense, first half | X 0 0 1 0 X X<br>X 0 0 1 1 X X<br>X 0 1 0 0 0 X | +90<br>+90<br>+90 | +90<br>+90<br>+90 | −90<br>−90<br>−90 | −90<br>−90<br>−90 | zero<br>zero<br>zero | zero<br>zero<br>zero | off<br>off<br>off | off<br>off<br>off | |
| Inverted Y-sense, second half | X 0 1 0 0 1 X<br>X 0 1 0 1 X X<br>X 0 1 1 0 X X | −90<br>−90<br>−90 | −90<br>−90<br>−90 | +90<br>+90<br>+90 | +90<br>+90<br>+90 | zero<br>zero<br>zero | zero<br>zero<br>zero | off<br>off<br>off | off<br>off<br>off | |
| Digital data coding (no button pushed) B3 B2 B1 B0 | 0 0 1 1 1 0 X<br>0 0 1 1 1 1 X<br>0 1 0 0 0 0 X<br>0 1 0 0 0 1 X<br>0 1 0 0 1 0 X<br>0 1 0 0 1 1 X<br>0 1 0 1 0 1 X<br>0 1 0 1 0 1 X | +90<br>−90<br>+90<br>−90<br>+90<br>−90<br>+90<br>−90 | +90<br>−90<br>+90<br>−90<br>+90<br>−90<br>+90<br>−90 | +90<br>−90<br>+90<br>−90<br>+90<br>−90<br>+90<br>−90 | +90<br>−90<br>+90<br>−90<br>+90<br>−90<br>+90<br>−90 | +90<br>−90<br>+90<br>−90<br>+90<br>−90<br>+90<br>−90 | +90<br>−90<br>+90<br>−90<br>+90<br>−90<br>+90<br>−90 | +90<br>−90<br>+90.<br>−90<br>+90<br>−90<br>+90<br>−90 | +90<br>−90<br>+90<br>−90<br>+90<br>−90<br>+90<br>−90 | |
| Regular X-sense, first half | X 1 0 1 1 X X<br>X 1 1 0 0 X X<br>X 1 1 0 1 0 X | +90<br>+90<br>+90 | −90<br>−90<br>−90 | +90<br>+90<br>+90 | −90<br>−90<br>−90 | off<br>off<br>off | off<br>off<br>off | zero<br>zero<br>zero | zero<br>zero<br>zero | |
| Inverted X-sense, second half | X 1 1 0 1 X X<br>X 1 1 1 0 X X<br>X 1 1 1 1 X X | −90<br>−90<br>−90 | +90<br>+90<br>+90 | −90<br>−90<br>−90 | +90<br>+90<br>+90 | off<br>off<br>off | off<br>off<br>off | zero<br>zero<br>zero | zero<br>zero<br>zero | |
| Digital data coding (button coded "15"d. pushed) B3 B2 B1 B0 | 1 0 1 1 1 0 X<br>1 0 1 1 1 1 X<br>1 1 0 0 0 0 X<br>1 1 0 0 0 1 X<br>1 1 0 0 1 0 X<br>1 1 0 0 1 1 X<br>1 1 0 1 0 0 X<br>1 1 0 1 0 1 X | −90<br>+90<br>−90<br>+90<br>−90<br>+90<br>−90<br>+90 | −90<br>+90<br>−90<br>+90<br>−90<br>+90<br>−90<br>+90 | −90<br>+90<br>−90<br>+90<br>−90<br>+90<br>−90<br>+90 | −90<br>+90<br>−90<br>+90<br>−90<br>+90<br>−90<br>+90 | −90<br>+90<br>−90<br>+90<br>−90<br>+90<br>−90<br>+90 | −90<br>+90<br>−90<br>+90<br>−90<br>+90<br>−90<br>+90 | −90<br>+90<br>−90<br>+90<br>−90<br>+90<br>−90<br>+90 | −90<br>+90<br>−90<br>+90<br>−90<br>+90<br>−90<br>+90 | |

*Fig. 8a*

Transmitter ROM - LED Output Phase Definition

| Address Lines | | LED Output Phase (degrees) | | | | |
|---|---|---|---|---|---|---|
| A11 A10 A9 A8 A7 A6 A5 A4 A3 A2 A1 A0 | | 'zero' | "180" | "+90" | "−90" | "off" |
| | 0  0 | off | on | on | off | off |
| | 0  1 | off | on | off | on | off |
| | 1  0 | on | off | off | on | off |
| | 1  1 | on | off | on | off | off |

*Fig. 8b*

Receiver ROM Contents Sequence with 4 Data Bits

| SEQUENCE INTERVAL | ADDRESS LINES 8 7 6 5 4 3 2 1 0 | sync gate | OUTPUTS phase ref. | window | discrete pulses |
|---|---|---|---|---|---|
| | 1 1 1 0 1 1 1 1 1 | off | −90 | off | strobe X |
| Sync & Phase-Reference | 1 1 1 1<br>0 0 0 0<br>0 0 0 0 1 1 1 1 1 | on | | | reset |
| Regular Y-sense, first half | 0 0 0 1<br>0 0 1 0<br>0 0 1 1 0 | off | +90 | +/−45 | |
| Inverted Y-sense, second half | 0 0 1 1 1<br>0 1 0 0<br>0 1 0 1<br>0 1 0 1 1 1 1 1 | | −90 | off | strobe Y |
| Digital B3 | 0 1 1 0 0 0 0 0 0<br>0 1 1 0 0<br>0 1 1 0 1<br>0 1 1 0 1 1 1 1 1 | | +90<br>−90 | | reset<br><br>strobe code |
| data B2 | 0 1 1 1 0 0 0 0 0<br>0 1 1 1 0<br>0 1 1 1 1<br>0 1 1 1 1 1 1 1 1 | off | +90<br>−90 | on | reset<br><br>strobe code |
| sensing B1 | 1 0 0 0 0 0 0 0 0<br>1 0 0 0 0<br>1 0 0 0 1<br>1 0 0 0 1 1 1 1 1 | | +90<br>−90 | | reset<br><br>strobe code |
| B0 | 1 0 0 1 0 0 0 0 0<br>1 0 0 1 0<br>1 0 0 1 1<br>1 0 0 1 1 1 1 1 1 | | +90<br>−90 | | reset<br><br>strobe code |
| Regular X-sense, first half | 1 0 1 0 0 0 0 0 0<br>1 0 1 0<br>1 0 1 1<br>1 1 0 0 0 | off | +90 | +/−45 | reset |
| Inverted X-sense, second half | 1 1 0 0 1<br>1 1 0 1<br>1 1 1 0<br>1 1 1 0 1 1 1 1 1 | | −90 | off | strobe X |
| Sync & | 1 1 1 1 | on | | | |

*Fig. 9*

INPUT DEVICE FOR A DISPLAY SYSTEM

FIELD OF THE INVENTION

This invention relates to an input device for a display system such as a television receiver, a computer, a video game or the like.

CROSS REFERENCE TO RELATED APPLICATIONS

U.S. patent application Ser. No. 16,804, U.S. Pat. No. 4,745,402 concurrently filed herewith is a related application.

BACKGROUND OF THE INVENTION

Display systems have become more complex in recent years. Television receivers, for example, have a greatly increased number of functions available to the user. These functions may include the routing and processing of stereo sound signals, the selection of various auxiliary video sources, the scheduling of future programs, etc. Typically, in order to utilize these functions, a relatively large number of function selection switches are required. This makes the input device such as the hand-held remote control transmitter large, difficult and confusing to use, and expensive to manufacture.

One way to minimize the number of switches on the remote control unit is to provide a display of a matrix of functions displayed on the screen of the display system, in what is sometimes called a menu, and to provide input selection apparatus for selecting which ones of the displayed functions are to be exercised. Menu based systems for use in television receivers are disclosed in U.S. Pat. No. 4,641,205 (Beyers) issued Feb. 3, 1987 and U.S. Pat. No. 4,626,892 (Nortrup et al.) issued Dec. 2, 1986, both of which are assigned to the same assignee as the present application.

The input device for a menu-based system may be a so-called "mouse", a joy stick or a light pen, each of which provides X-axis and Y-axis position information to a display controller for determining the desired function. Typically, the user must use both hands or must have a flat surface on which to move the device. Most of these devices are wired to the controller and therefore do not lend themselves to remote control at distances usually associated with television viewing.

It is desirable, however, that an input device make use of the human propensity to point at a desired item, thus providing ease of operation. Light pens and touch-screens provide such a pointing function but necessarily require the user to be within an arm's length of the display screen. A wireless input device used for pointing to a particular item to be selected from a menu displayed on a display screen is disclosed in U.S. Pat. No. 4,565,999 (King et al.) issued on Jan. 21, 1986.

SUMMARY OF THE INVENTION

It is herein recognized that it is desirable to transmit, along with pointing function data, non-pointing function data such as channel number and program time information, since such numeric data does not lend itself easily to selection from a menu. It is also recognized herein that speed in selection of a particular function will be improved by transmitting information related to that function, rather than transmitting pointing function signals only.

A remote control system according to the invention comprises a remote transmitter, with energizing circuitry for energizing transducers of the remote transmitter with position related information signals indicating the direction in which the transmitter is pointing for menu-type function selections in a first transmission period and non-position related information signals related to dedicated functions in a second transmission period.

Another aspect of the invention is that the position information transducers are also utilized for sending the non-position related data.

BRIEF DESCRIPTION OF THE DRAWING

FIGS. 1a and 1b, respectively, show, a perspective view of a display device and a remote transmitter which may utilize the present invention, and a more detailed plan view of a remote transmitter suitable for use with the invention.

FIG. 7 shows, in block diagram form, the remote control receiver circuitry for decoding remote control signals generated by the remote control transmitter of FIG. 6.

FIGS. 8a and 8b illustrate the contents of a memory used in the remote control transmitter circuitry shown in FIG. 6.

FIG. 9 illustrates the contents of a memory used in the receiver circuitry shown in FIG. 7.

DETAILED DESCRIPTION OF THE DRAWING

Figure 3:
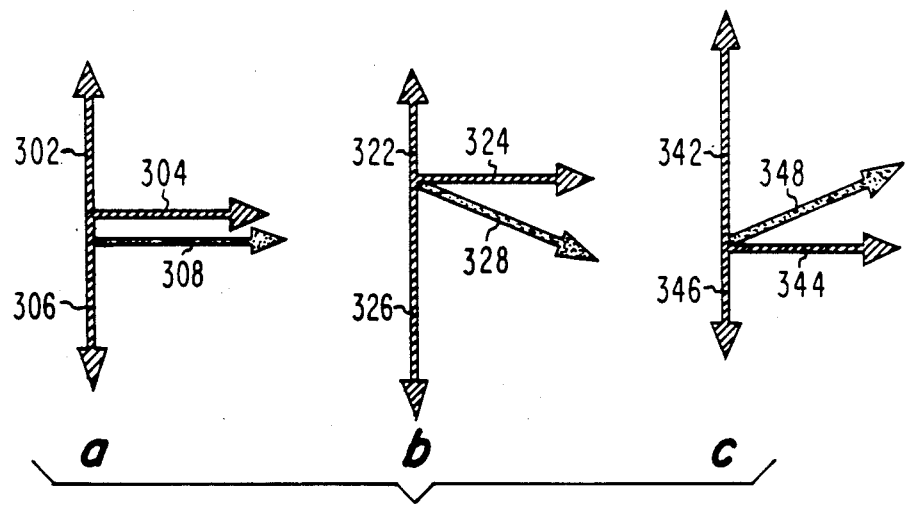
FIGS. 3a, 3b and 3c show vector diagrams of signals associated with the three-LEDs transducer and beam array shown in FIG. 2 and useful in understanding a Y-axis angular position measurement cycle of operation of the transmitter shown in FIG. 1.
Figure 4:
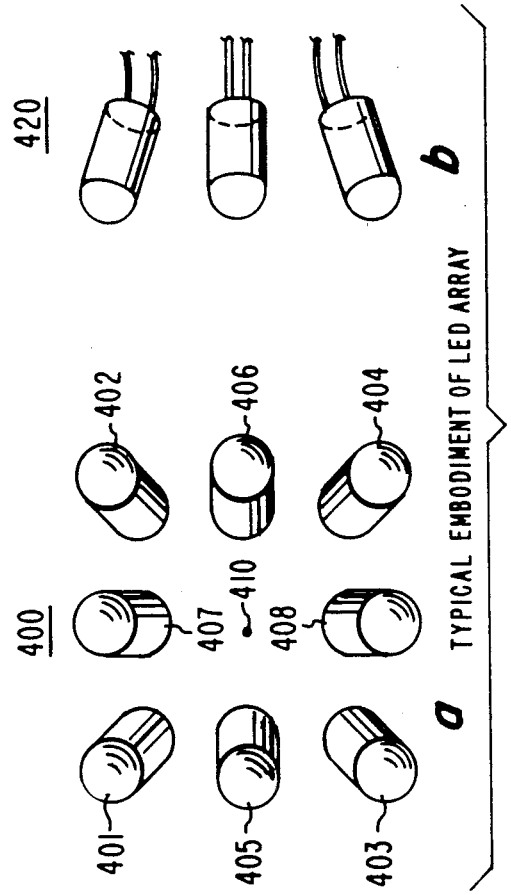
FIGS. 4a and 4b show front and side views, respectively, of a complete LED array suitable for use with the remote transmitter unit shown in FIG. 1.

The display system of FIG. 1a includes a hand-held remote transmitter 101, subject to movement by a user. When activated, transmitter 101 transmits signals along divergent signal paths 102a, 102b, and 102c in a manner to be explained with respect to FIGS. 2, 3 and 4. Preferably, these signals are in the form of infrared (IR) radiation transmitted from respective light-emitting diodes (LEDs). Transmitter 101 has a natural pointing axis which may be defined as the path along which it is expected by the user that signal will be emitted when the transmitter is activated. Nominally, the pointing axis is along the longitudinal axis of symmetry of the rectangular enclosure encompassing the transmitter circuitry.

A sensor 103 for receiving signals from remote control transmitter handunit 101 is mounted adjacent to display screen 104 of display apparatus 105. Display screen 104 displays a menu of functions to be selected by a viewer. An index or cursor 106 is moved about the screen in response to pointing motions of the transmitter handunit, in a manner to be described below. When the cursor is detected proximate to the title of a function, a box 107 may be displayed to highlight the function desired. A scroll bar 108 having a position indicator 109 may be illuminated on display screen 104 to assist the viewer in making adjustments of the selected function (i.e., volume, brightness, tint, color).

The remote control handunit 101', illustrated in greater detail in FIG. 1b, corresponds to transmitter 101 of FIG. 1a. Transmitter 101' includes a 15 key keyboard 120 with which a user can send one of 15 different 4-bit keycodes to the receiver. The sixteenth 4-bit keycode is reserved for the "no-key-pressed" condition to be described below. While the previously described menu-type selection is acceptable for selecting certain functions such as those which are infrequently used (e.g., such as color, tint, contrast), certain dedicated function keys are provided for selecting frequently used and numerical functions. One key is assigned to the pointing function, and its activation causes the display of a pointing function menu on the display screen. In the preferred embodiment, ten of the keys are dedicated to the numerals 0-9, and four of the remaining five keys are assigned to channel-up, channel-down, power on/off and audio mute functions. Thus, the remote control handunit provides both pointing information, and non-position related data for those functions which are better accomplished with direct input rather than by pointing to a menu selection.

The pointing operation of the remote control system can be briefly explained as follows.

Angular movement of the transmitter with respect to the receiver will change the amplitude and phase of the resultant IR signal modulation components received from the transmitter LEDs in each of several cyclical time-multiplexed angular position measurement intervals. The changes in vector phase in the X-axis and Y-axis measurement intervals will be reflected by the receiver circuitry in a change in the magnitudes of the X-axis and Y-axis data, respectively. A microcomputer uses the X-axis and Y-axis data to position a cursor 106 on video display screen 104 of FIG. 1. Cursor 106 provides visual feedback for the user.

The term "phase modulation" as used herein means a fixed offset in electrical phase from a 0° phase reference. In the present embodiment, in each measurement interval of the cyclical sequence, LEDs of the handunit having respective fixed physical angular offsets from the pointing axis of the remote control handunit are simultaneously energized with respective signals having corresponding fixed phase shifts from a 0° reference phase. The relative amplitudes of the IR signal components received by sensor 103 vary in response to transmitter handunit pointing angle. The sensor receives and combines the IR signal components to produce a signal exhibiting a resultant phase modulation, and generates an electrical signal having the same phase modulation as the resultant IR signal. The angular position information to be conveyed is found in the phase angle of the resultant of the combined signals received from the energized LEDs. Because the pointing angle information is represented by the phase angle of the electrical signal, the amplitude of the electrical signal does not need to be preserved and, therefore, may be amplified and limited.

A more detailed explanation of the pointing function of the remote control system follows.

Figure 2:
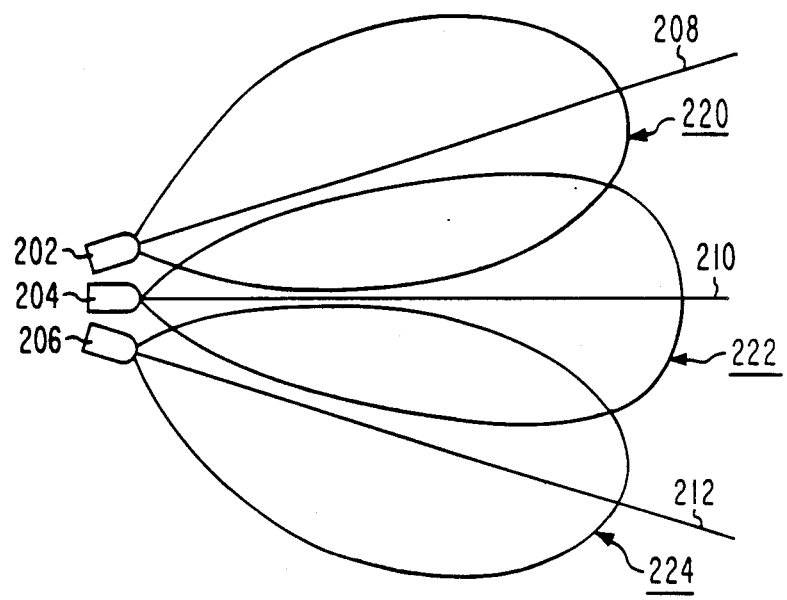
FIG. 2 shows a side view of a three-LED transducer and beam array useful in understanding a Y-axis angular position measurement cycle of operation of the transmitter shown in FIG. 1.

Referring to FIG. 2, infrared (IR) LEDs 202, 204 and 206 are mounted on a remote control transmitter handunit (not shown). Each of LEDs 202, 204 and 206 has an associated pointing axis 208, 210 and 212 respectively along which IR light will be transmitted with greatest intensity. Pointing axes 208, 210 and 212 correspond to pointing axes 102a, 102b and 102c of FIG. 1. The LEDs are physically disposed at divergent angles from the pointing axis of the handunit so as to enable a receiver to determine the angular position of the handunit and move the cursor accordingly. The IR light from LEDs 202, 204 and 206 is transmitted in radiation patterns 220, 222 and 224, respectively, with the radiant intensity decreasing monotonically with increasing radiating angle relative to the LED pointing axis. Upward-pointing LED 202 is excited by the application of an energizing signal which exhibits a +90° phase shift from a reference-phase signal. Horizontally-pointing LED 204 is excited by the application of an energizing signal which exhibits a 0° phase shift from a reference-phase signal. Downwardly pointing LED 206 is excited by the application of an energizing signal which exhibits a −90° phase shift from a reference-phase signal. That is, oppositely oriented LEDs are energized with oppositely phase-shifted energizing signals. The above-mentioned energizing signals are applied, for example, during the Y-axis measurement interval of the cyclical sequence when a user presses a pointing function button on the handunit.

The three LED energizing signals (+90°, 0°, −90°) are unidirectional squarewaves which cause the LEDs to radiate constant amplitude bursts of IR. The receiver sensor converts the received bursts of IR back to unidirectional squarewaves. As is well known, a squarewave may be considered to be a linear summation of DC, fundamental and harmonic terms. A bandpass filter, contained within the receiver sensor module, rejects the DC and harmonic terms, leaving only the three fundamental signals. These fundamental signals are sinusoids at the same modulation frequency having different phases and different amplitudes. The bandpass filtering should be done when the signals are still at a low level so that linearity is maintained. Since the three sinusoidal components are of the same frequency, they may be considered as vectors which sum to a single vector resultant as shown in FIGS. 3a, 3b and 3c. The resultant signal may be amplified and limited (i.e., clipped), because the information to be preserved is in the phase of the resultant signal and not in its amplitude. As will be explained below, this information is extracted by phase detector circuits which compare the phase of the resultant signal to a known reference phase.

FIGS. 3a–3c illustrate the IR modulation components of the signal received at the receiver, and is useful in understanding the operation of the system. Vector diagram 3a shows the relationship of the three signals at the receiver when the handunit is aimed directly at the receiver, that is, when the pointing axis of the handunit is parallel to the line of sight between the handunit and the receiver. Note that because the contribution received from upward pointing LED 202 (+90° phase modulation represented vector 302) is equal and opposite to the contribution received from downward pointing LED 206 (−90° phase modulation represented by vector 306), these two components cancel and the resultant vector 308 is equal to the horizontal component 304 contributed by horizontally-pointing LED 204 (0° phase modulation). While vector 308 is shown below vector 304 for clarity, it should be understood that it actually lies along vector 304. Thus, a horizontally-pointed remote control transmitter handunit may be determined by the receiver circuitry from a resultant vector which is in-phase with the reference phase.

Vector diagram 3b shows the relationship of the three signals at the receiver when the handunit is aimed upwardly with respect to the line of sight between the handunit and the receiver. Because the handunit is pointing upwardly, the contribution of vector 322 from the upward-pointing LED 202 is less than in the previous example. Since the downward-pointing LED 206 however is now pointing more directly at the receiver, the contribution of vector 326 is greater than in the previous example. These amplitude changes are in accordance with radiation patterns 220, 222 and 224 described above. The contribution from the horizontally-pointing LED 204 as represented by vector 324 remains about the same as in the previous example. Since the vector 322 has a magnitude which is less than vector 326, the resultant vector 328 exhibits a negative excursion. Thus, an upwardly-pointing remote control transmitter handunit may be determined from a resultant signal exhibiting a negative phase angle and the amount of upward angular displacement of the remote control transmitter handunit from the horizontal position is represented by the amount of negative phase displacement from the reference phase.

Vector diagram 3c shows the relationship of the three signals at the receiver when the handunit is aimed downwardly with respect to the line of sight between the handunit and the receiver. Because the handunit is pointing downwardly, the contribution of vector 346 from the downward pointing LED 206 is less than in the first example. The upward-pointing LED 202 however is now pointing more directly at the receiver and the contribution of vector 242 is greater than in the first example. The contribution from horizontally-pointing LED 204 remains about the same as in the first example. Since the vector 346 has a magnitude which is less than vector 342, the resultant 348 exhibits a positive excursion. Thus, a downwardly-pointing remote control transmitter handunit may be determined from a resultant signal exhibiting a positive phase angle and the amount of downward angular displacement of the remote control transmitter handunit from the horizontal position is represented by the amount of positive phase displacement from the reference phase (0°). X-axis measurement is accomplished in a manner substantially the same as described above except that the LEDs energized on the handunit are leftward pointing, center pointing and rightwardly pointing.

Two measurement intervals are included in a repetitive cycle during which the LEDs are individually driven at different phases of the carrier frequency. Each measurement interval allows the receiver circuitry to determine the pointing direction of the handunit relative to the line of sight between the handunit and the IR sensor at the receiver about one axis. One measurement interval is used for determining lateral (X-axis) pointing, and the second measurement interval is used for determining vertical (Y-axis) pointing.

FIGS. 4a and 4b show a front view 400 and a side view 420, respectively, of the preferred embodiment of an LED array suitable for use on the remote control transmitter handunit shown in FIG. 1. Other LED configurations may also be used in the invention. However, when choosing one it is important that the pointing axes of the individual LEDs diverge from one another and from the pointing axis of the handunit, so that there is as little crosstalk between axes as possible. For good operation over a relatively long distance (30 feet) between the remote control transmitter handunit and the receiver, it is desirable that the amplitude of the resultant IR signal should be relatively uniform over the range of pointing angles of interest. A typical divergence angle between elements 401 and 405 is about 30 degrees. When the handunit is tilted downward more than 30°, for example, the strength of the IR signal received from a downwardly pointing LED is sharply reduced. Therefore, the range of pointing angles of interest of ±30° corresponds to an LED divergence angle of 30°. However, as the handunit of the present invention is rotated within the range of angles of interest, the amplitude of the resultant IR signal at the receiver sensor remains essentially constant because while the radiated IR signal received from one angularly disposed LED is decreasing, the radiated IR signal from the oppositely oriented LED is increasing. As noted above, the IR signal strength from the center pointing LED remains about the same within the range of angles of interest.

Figure 5:
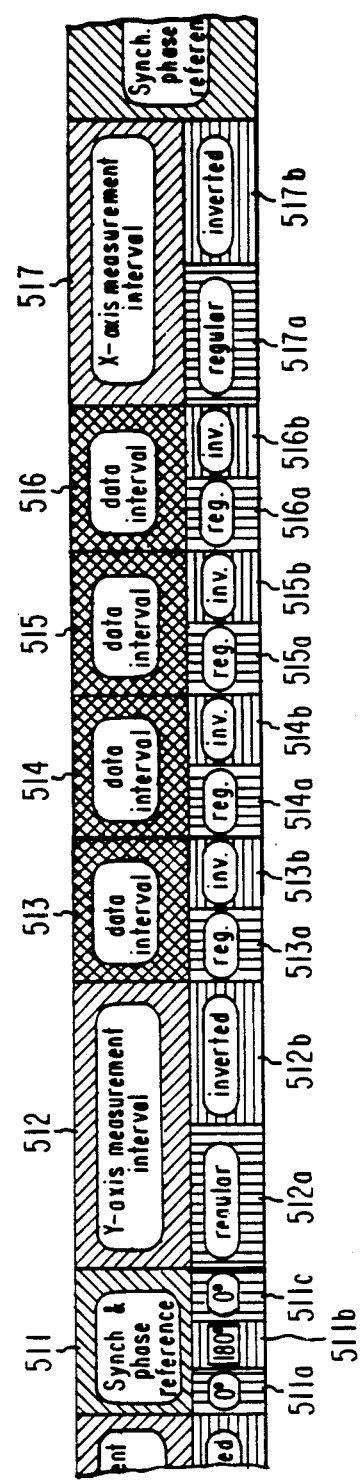
FIG. 5 illustrates a signal cycle sequence for use with the LED array shown in FIGS. 4a and 4b.

The four corner LEDs (401, 402, 403 and 404) are each aimed with equal X-axis and Y-axis offset angles from the handunit pointing axis 410. Each of the four side LEDs (405, 406, 407 and 408) has an X-axis or a Y-axis offset angle, respectively, but is centered about the other axis. FIG. 5b illustrates that the IR transmission from the remote control handunit is partitioned into 4 principal intervals: synch and phase-reference, Y-axis measurement, data measurement, and X-axis measurement. Signals transmitted during the synch and phase-reference interval synchronize the receiver timing with that of the transmitter handunit, and establish a 0° phase reference at the receiver to provide a reference from which to measure modulation phase angle displacement. In the Y-axis measurement interval, there occurs the simultaneous energization of horizontally pointing LEDs 405 and 406, upwardly pointing LEDs 401 and 402, and downwardly pointing LEDs 403 and 404 with their respective phase modulated signals. During the data measurement interval, a signal representative of the output of an array of pushbutton switches is transmitted simultaneously by all of the LEDs using the same energizing signal. In the X-axis measurement interval, there occurs the simultaneous energization of center pointing LEDs 407 and 408, leftwardly pointing LEDs 401 and 403, and rightwardly pointing LEDs 402 and 404 with their respective phase modulated signals. During each of X and Y intervals, LEDs 401-408 are driven with signals having predetermined different phases. The phases of the LEDs for the X-axis and Y-axis measurement intervals for the embodiment shown in FIG. 5 described below is listed in Table 1.

TABLE 1

| LED No. | Excitation Phase During X-Axis Measurement Interval | | Excitation Phase During Y-Axis Measurement Interval | |
|---|---|---|---|---|
| | First Half | Second Half | First Half | Second Half |
| 401 | +90 | −90 | +90 | −90 |
| 402 | −90 | +90 | +90 | −90 |
| 403 | +90 | −90 | −90 | +90 |
| 404 | −90 | +90 | −90 | +90 |
| 405 | off | off | 0 | 0 |
| 406 | off | off | 0 | 0 |
| 407 | 0 | 0 | off | off |
| 408 | 0 | 0 | off | off |

The receiver circuitry, on detecting the presence of the modulated IR radiation, signals the microcomputer to cause the display apparatus to display a menu of functions. Various known menu display programs may be used for this purpose. By way of example, a menu display program similar to "Control Panel" of "Macintosh Finder" used in the Apple Macintosh Computer may be used. When the X-axis and Y-axis measurement values have been passed from the receiver circuitry to the microcomputer, the microcomputer causes the display controller to display a cursor on the screen along with the menu. In this way, the user receives visual feedback which enables him to position the pointer until it is near the area of the screen in which the desired function is displayed. The pointer is positioned by moving the handunit as described above.

To cause the selection of the desired function, the display controller can be programmed to accept as a selection indication the loss of signal, due to release of the pointing function key, after the cursor is within the display area for a predetermined time. Alternatively, the audio mute function can be eliminated and that key can be assigned to be the select key. The depression of the select key can be used to make the selection when the pointer is adjacent to the desired displayed function. The latter avoids an unintentional selection due to a temporary loss of signal caused by, for example, the passage of an object between the receiver and transmitter.

The operation of the remote control transmitter handunit will be explained with reference to FIG. 6. In operation, when the user wants to select a particular function, one of pushbuttons 601-615 is pressed. The depression of a pushbutton applies a signal via OR-gates 622-628 and 630, 10 second one-shot 632 and OR-gate 634 to enable power switch 636. Power from battery 640 is thus applied to the transmitter circuitry which initiates IR radiation. The application of power causes oscillator 642 to produce a 3.58 MHz signal which is applied to the input of divide-by-eight counter 644. Divide-by-eight counter 644 produces a 447 KHz signal which is applied to the input of 12-stage binary counter 646. The output lines of binary counter 646 provide most of the addressing to read-only memory (ROM) 648. ROM 648 is arranged as 4096 memory locations having 8 bits each. Each of the eight bits is associated with a particular LED. As can be seen from FIG. 5, bit $0_1$ is connected to driver amplifier 651 which drives LED 661, similarly bits $0_2-0_8$ are respectively connected to driver amplifiers 652-658 which drive LEDs 662-668, respectively.

The ROM address lines $A_0-A_{11}$ are separated into three distinct groups. The first group comprises address lines $A_0$ and $A_1$ which are cycled through four states by counter 646 to allow bit outputs to be a square-wave at a selected phase of the IR carrier frequency (56 KHz at the oscillator frequency shown). FIG. 8b shows that an individual LED may be energized with one of four possible phases of the 56 KHz IR carrier signal or may be turned off. For a particular LED to be energized with "$-90°$ phase", for example, the output bit associated with that LED must have a "low" level ("off") stored in those memory locations which are addressed when address lines $A_1$ and $A_0$ are energized with binary signals 00 and 11, and must have a "high" level ("on") stored in those memory locations which are addressed when address lines $A_1$ and $A_0$ are energized with 01 and 10 binary signals.

The second group of address lines comprises address lines $A_2-A_7$ which define 64 groups of memory locations with each group comprising 4 memory locations. Counter 646 repetitively cycles ROM 648 through these 64 groups. Because stages $Q_4-Q_6$ of binary counter 646 are interposed between the stages which define carrier phase and those which define the 64 sequential groups, each group is cycled 8 successive times before the higher-order address ($Q_7-Q_{12}$) advances ROM 648 to the next group. The 64 group sequence takes about 9.2 milliseconds (in the illustrated embodiment).

FIG. 8a lists the 9 sequence intervals defined by address lines $A_2-A_7$ and the groups within each sequence interval, and the output phases required to energize the individual LEDs for each group. The 9 sequence intervals are shown in FIG. 5 described below. The Xs in FIG. 8a indicate "don't care" states. That is, the output listed to the right will be produced for either value assumed by the address bit containing the X. Ignoring address bits 8-11 for the moment, it can thus be seen, for example, that the Synch and Carrier Phase-Reference interval is composed of three groups in which all of the LEDs will be driven with zero° phase signals, followed by two groups of 180° phase signals, and three more groups of zero° phase signals. The Sync and Carrier Phase-Reference interval is followed by the Regular and Inverted Y-sense intervals, Regular and Inverted Data intervals, and Regular and Inverted X-sense intervals.

During the data intervals of the cycle, the LEDs are driven in unison at one of two different phases of the carrier frequency. The choice of transmitted phase sends one bit of information to the receiver in each of the data intervals. The data transmission phase is based on the state of switches 601-615, and is used to send numeric data, such as channel number, or other dedicated data, such as mute, on-off, or alternate menu selection, directly to the receiver rather than selecting an item from a displayed menu via the pointing function. As can be seen from FIG. 6, the third group of address lines $A_8-A_{11}$ are coupled to the outputs of OR-gates 622-628, respectively, and are thus responsive to the state of switches 601-615. The ROM contents for two states of address lines $A_8-A_{11}$ are shown in FIG. 8a. (The contents addressed by the closed condition of switch 615 are shown below the main portion of the figure).

Figure 6:
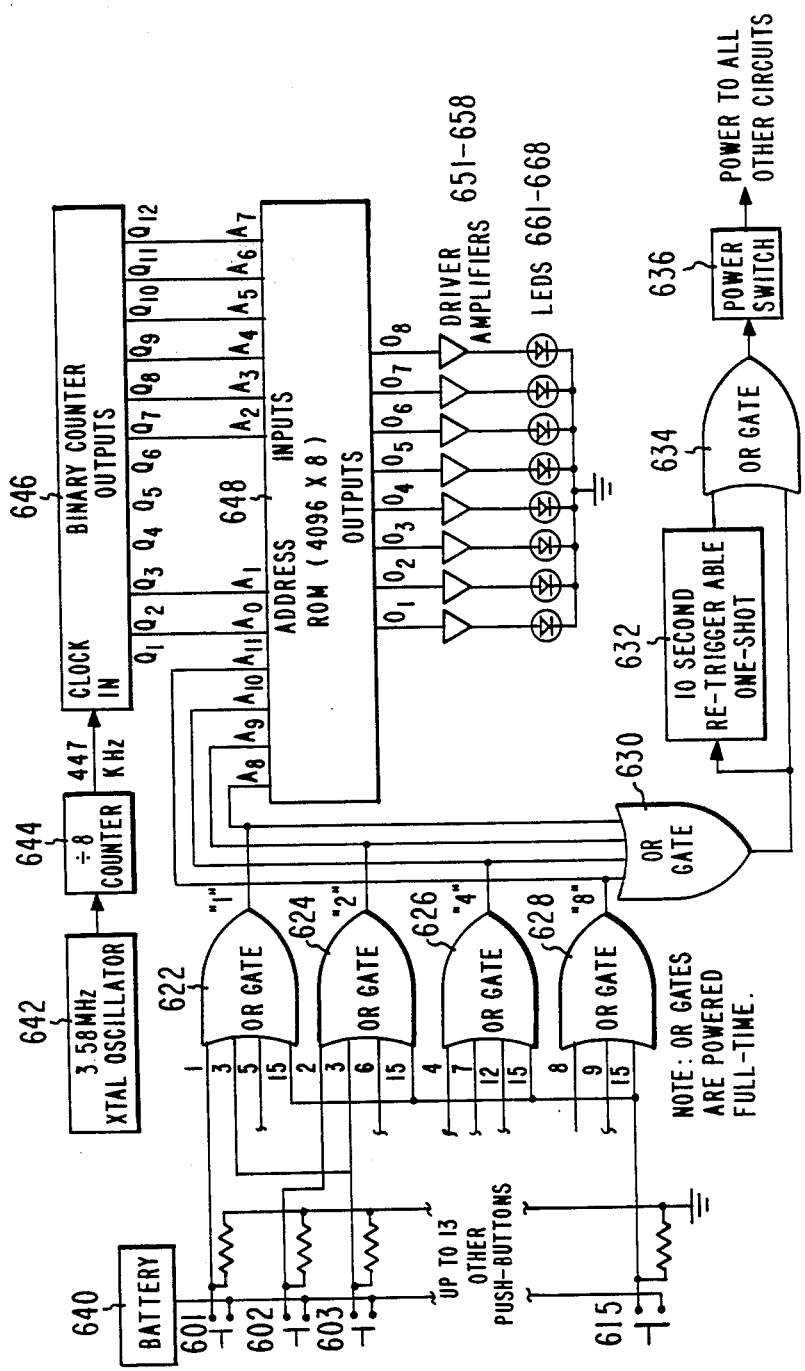
FIG. 6 shows, in block diagram form, the circuitry of a remote control transmitter unit for the LED array shown in FIGS. 4a and 4b.

As can be seen from FIG. 6, the handunit becomes active only when a pushbutton is pressed. In order to send a "no-key-pressed" signal, one of the keys must be pressed momentarily, then released quickly. This action will result in a transmission of that key code followed by a transmission of the "no-key-pressed" code. If the "no-key-pressed" signal is used to perform the "pointing function", a particular key having an innocuous function such as "cursor on" should be used to activate the transmitter to avoid undesirable results due to the transmission of the code of the pressed switch. However, it is recommended that a separate "pointing function" key be provided from one of the 15 possible key codes to avoid confusion and enable the user to continuously press the pushbutton while using the pointing function as shown in FIG. 1b.

Referring to FIG. 5, the system must provide means for synchronizing the timing of the receiving circuits at the receiver to the transmitted cycle sequence, and for establishing a reference phase of the carrier frequency. In one embodiment, the system uses a phase-lockedloop (PLL) circuit, which is designed to oscillate at the transmitted carrier frequency and to be locked in phase to the phase of the transmitted carrier. It is herein recognized that when the dedicated-function data is included along with the pointing-function data in a single IR transmission, a considerable saving in component count, cost and complexity is realized by utilizing common receiving and synchronizing circuitry. If pointing-function data were to be sent independently of the dedicated-function data, receiver complexity would be undesirably increased by additional circuitry to determine which type of data was being received. In the present invention, however, since the data interval occupies a predetermined time slot in every transmission, no such circuitry is required.

The PLL circuit time-constant is made long enough for stability and noise-rejection. The transmitted cycle is made to have an average phase-angle of zero, as follows: Each measurement interval (X,Y, or data) is divided into two equal halves. For purposes of explanation, the Y-axis measurement interval 512 will be described. This detailed description also applies to the X-axis 517 and data 513, 514, 515, 516 intervals each having first and second halves 517a, 517b and 513a, 513b, 514a, 514b, 515a, 515b, 516a, 516b, respectively. During the first half, 512a, the LEDs are variously driven at +90°, 0°, and −90° phases, as described above. During the second half, 512b, the LED drive phases are reversed, so that the LEDs driven at +90° in the first half are driven at −90° in the second half, and vice-versa. The LEDs driven at 0° phase remain so through both halves of the measurement interval. The phase angle of the resultant signal at the receiver will then be of equal magnitude but of opposite signal in the two halves, and therefore will average to 0° phase. Once the PLL circuit has had time to stabilize at the average (0°=reference) phase, a burst of 180 deg. phase 511b, in the middle of synch and phase-reference interval 511, may be detected and used to synchronize the receiver timing to that of the transmitter. If the synch burst interval 511b is kept relatively short it will not significantly pull the PLL circuit away from the reference phase. The contents of the PROMs shown in FIGS. 8a, 8b and 9 reflect the system illustrated by FIG. 5.

The operation of the IR receiver circuitry of the invention will be explained with reference to FIG. 7. An IR wave from the handunit is converted to an electrical signal by IR sensor and preamp unit 702, is filtered to select the desired modulation frequency, and amplified. The output signal from IR sensor and preamp unit 702 is further amplified by amplifier 704 and applied to the input of amplitude detector 706 which produces a D.C. level representative of the amplitude of the received modulated IR signal. This D.C. level is compared in comparator 710 against a reference level, set by adjustment of a potentiometer 708. If the amplitude of the received IR is sufficient, comparator 710 generates an "IR-on" signal which is applied to interface circuit 770 for use in various functions such as enabling menu display by microcomputer 780. The "IR-on" signal is also applied to one input of AND-gate 712 and to the trigger input of 500 ms one-shot 714. One-shot 714 generates an "acquire gate" signal which is coupled via OR-gate 716 to the other input of AND-gate 712. Since both inputs of AND-gate 712 are enabled, a "PLL and Synch Enable" signal is generated at its output, and applied to PLL phase-detector 730 and 9 microsecond one-shot 746.

The output of amplifier 704 is also coupled to limiter amplifier 718 where it is further amplified and limited to produce a squarewave signal having the same frequency and phase as the modulation of the signal sensed at IR sensor and preamp unit 702. This limited signal is fed to a vector phase detector 720, a PLL phase detector 730, and a synch phase detector 738.

The timing and control of most of the receiver circuit functions are provided by a phase-locked 3.58 MHz voltage-controlled crystal oscillator (VCXO) 736, the output of which is divided successively by a 6-stage binary counter 748 and a 9-stage binary counter 750. Nine particular outputs of these counters are used to address a 512 word by 8 output bits per word ROM integrated circuit 760 with contents as shown in FIG. 9. The least-significant address bits are provided by the 3 most-significant stages of 6-stage counter 748. These bits continuously cycle through 8 states at a rate matching the received IR carrier (about 56 KHz). The most-significant output bit of 6-stage counter 748, also designated "PLL zero-reference" is compared to the 56 KHz output of the limiter, by PLL phase-detector circuit 730. The resulting phase-error pulses are controlled by PLL gain potentiometer 732 and are low-pass filtered by low-pass filter 734, and used to control VCXO 736, thereby closing the loop. A PLL 90° reference signal is also applied to PLL Phase detector 730 to steer the phase detector during acquisition of lock.

The 6 most-significant ROM address bits are provided by the 6 most-significant stages of 9-stage counter 750. These bits cycle through a sequence (approximately 9.2 milliseconds in duration), corresponding to the transmitted sequence.

When the IR signal from the remote control handunit is first received, the leading-edge of the IR-on signal triggers one-shot 714 which outputs an "acquire gate" signal for a fixed interval (e.g., 500 milliseconds). This gate signal causes PLL phase-detector 730 to be enabled so that it pulls into the frequency and phase of the received 56 KHz, as rapidly as possible.

Once the PLL has been locked to the proper 56 KHz phase, synch phase-detector circuit 738 can use the PLL zero-reference to detect the short burst of 180 degree phase transmitted within the Synch interval (see FIG. 8a). This detected synch pulse is low-pass filtered by LPF 740, compared to a threshold value by comparator 744. Then the result is used to trigger a 9 microsecond one-shot 746 which, in turn, causes 9-stage counter 750 to be reset, thereby causing it to be properly synchronized relative to the transmitted 9.2 millisecond cycle.

After the elapse of 500 milliseconds (enough time for proper carrier phase-lock and cycle-synchronization to be established), the acquire-gate signal is terminated. PLL phase detector 730 and reset one-shot 746 are then disabled except during the "sync gate", which is one of the ROM outputs (see FIG. 9). This change reduces the synch circuit's vulnerability to noise bursts, and improves the accuracy of the PLL circuit by allowing it to function only during the period when a known carrier phase is being transmitted by all the LEDs of the remote control handunit, in unison.

The other outputs of ROM 760 are used to measure the phase of the received carrier during the intervals in which he x-axis and y-axis differential phase transmissions occur (see FIG. 5). The phase reference signal supplied to vector phase detector circuit 720 is a squarewave at +90° phase during the "regular" X, Y, or data sense intervals (first half), and is at −90° phase during the "inverted" intervals (second half). Vector phase detector circuit 720 is an exclusive-OR (XOR) gate, and its output is a double-frequency (112 KHz) waveform with a duty-cycle proportional to the phase difference between the received signal and the phase reference. This variable duty-cycle signal is ANDed in AND-gate 722 with a window waveform, and with a fixed high-frequency (19.6 MHz) signal from 19.6 MHz oscillator 724 to convert it to bursts of pulses, with the number of pulses per burst proportional to the detector output duty cycle. The output of AND-gate 722 is used to clock a 15-stage binary counter 728. Counter 728 is reset to zero by a pulse from ROM 760 prior to the start of each measurement interval (X, Y, or data). The total count accumulated during the measurement interval is proportional to the vector phase detector output, averaged over the whole interval. The purpose of the window waveform is to prevent excessive counts from accumulating in counter 728 by limiting the counting interval to that portion of the 112 KHz waveform in which the variation in count will take place. Also, the window waveform may be used to freeze the outputs of counter 728 at the end of the measurement interval.

The 12 most-significant bits of the binary count of counter 728 are applied to the inputs of two 12-bit latch circuits 762 and 764. Latch 762 is strobed by a pulse from ROM 760 after the X-measurement interval, and latch 764 is strobed similarly after the Y-measurement interval. After each data measurement interval, the count of counter 728 should be either very high or very low, according to the phases transmitted by the remote control handunit. The magnitude of the count of counter 728 is compared to a fixed threshold count by a magnitude comparator gate 766 to produce a binary 1 or 0 in response to the measurement performed in each of the data measurement intervals. The binary result is then clocked into one stage of a four-stage shift register 768 by a pulse from ROM 760. Thus, 4-bit shift register 768 contains a representation of the 4-bit keycode transmitted by the remote control transmitter. Finally, the outputs of latch 762, latch 764, and 4-bit shift register 768, and the "IR-on" signal, are interfaced as data to the associated computer 780 by digital techniques known in the art. Microcomputer 780 may be external to the display device and may be, for example, an IBM PCjr. In such arrangement the X-axis and Y-axis signals may be connected to the joystick port X-axis and Y-axis inputs. A control program can then be written in IBM Basic which has statements which read the joystick port directly. Other statements can be used to move an illuminated point in response to the data read from the joystick port. Microcomputer 780 may use the numeric or non-position-related data, for example, to control tuner 790 to tune desired channels. The numeric data may also be used for setting a real-time clock which may be included within microcomputer 780. Other non-position-related data may be used, for example, to recall a time display, to turn the receiver on or off, to select or deselect a mute function, or for display of one of several menus for use with the pointing function.

While the embodiments shown have included LEDs for IR transmission, it should be appreciated that any suitable medium of transmission may be employed, such as, ultrasonic, microwave or visible light.

Note that while preferred embodiment relates to phase-encoded position type systems, others can be used. The preferred embodiment is described with respect to a phase-encoded transducer system, in which the transmitted signals which are offset in phase from one another are combined at a receiver to produce a resultant signal having a phase angle representative of the angular position of the remote control transmitter relative to the receiver. A system of this type is the subject matter of my copending, concurrently filed application RCA 82,771 which is assigned to the same assignee as the present application.

What is claimed is:
1. A remote control system, comprising:
handheld remote transmitting means having a pointing axis and including transducing means disposed for radiating a plurality of predetermined angularly spaced information beams when energized;
means for energizing said transducing means during a transmission period always having first and second portions, said transducing means being individually energized during said first portion with energizing signals corresponding to associated ones of said plurality of beams;
data input means mounted on said remote transmitting means and responsive to user input for providing a data signal which is related to a dedicated function;
encoding means coupled to said data input means and said plurality of transdicers for encoding said data signal and applying an encoded data signal to said plurality of transducers simultaneously during said second portion of said transmission period; and
receiving means substantially displaced from said receiving means along a line of sight between said remote transmitting means and said receiving means for receiving said plurality of beams transmitted during said first portion of said transmission period and responsive to relationships between signals derived from said plurality of beams for producing control signals indicative of the angular displacement of said pointing axis of said remote transmitting means relative to said line of sight between said remote transmitting means and said receiving means; and for receiving said plurality of beams transmitted during said second portion of said transmission period and responsive to signals derived from said plurality of beams for processing data related to said dedicated function.
2. The display system of claim 1 wherein:
said transducers are sequentially energized with the same phase signals such that the relative angular position of said remote transmitting means may be inferred from the relative amplitudes of the signals received from the sequentially energized transducers.
3. The display system of claim 1 wherein:
said transducers are energized with signals which are phase-shifted such that oppositely oriented transducers are energized with oppositely phase-shifted signals.
4. The display system of claim 3 wherein:
said transducers are energized uniformly with the same phase when transmitting said data signal.
5. The display system of claim 3 wherein:
said receiving means comprises a phase-locked loop for detecting the phase angle of a synchronizing portion of said transmitted signal, said synchroniz- ing portion of said transmitted signal being used to synchronize circuits of said receiving means.

6. The display system of claim 5 wherein: said receiving means further comprises memory means for generating reference signals for comparison against said transmitted signal for the decoding thereof.

7. The display system of claim 6 wherein: said receiving means further comprises counter means for addressing said memory means in response to signals of said phase-locked loop means.

8. The display system of claim 7 wherein: said synchronizing means comprises synch phase detector means for detecting a predetermined phase of said transmitted signal for resetting said counter means to the proper count to decode said transmitted signal.

9. The display system of claim 8 wherein: said receiving means further comprises vector phase-detector means for comparing said reference signals of said memory means with said transmitted signal and for producing an output representative of the phase difference between said reference signal and said reference signal, said phase difference being representative of said angular position of said transmitter means.

10. The display system of claim 9 wherein: said data signal comprises a predetermined number of binary digits.

11. The display system of claim 10 wherein: said predetermined number is four.

12. The display system of claim 11 wherein: said data input means comprises a keyboard having multiple keys.

13. The display system of claim 12 wherein: said keyboard of said data input means comprises fifteen keys.

14. The display system of claim 2 wherein: said data signal comprises a predetermined number of binary digits.

15. The display system of claim 14 wherein: said predetermined number is four.

16. The display system of claim 15 wherein: said data input means comprises a keyboard having multiple keys.

17. The display system of claim 16 wherein: said keyboard of said data input means comprises fifteen keys.

18. A display system, comprising:
handheld remote transmitting means, having a pointing axis and being subject to movement, for producing a signal when energized, said signal always comprising a first portion and a second portion;
means for receiving said signal said receiving means being substantially displaced from said remote transmitting means along a line of sight between said remote transmitting means and said receiving means;
means having a display surface and coupled to said receiving means for displaying an index at a point derived from said first portion of said signal;
a plurality of transducers mounted on said transmitting means, individually energized during said first portion of said signal, and physically disposed so as to enable said receiving means to determine the position of said index on said display surface, said index at said point exhibiting movement in response to the angular position of said pointing axis of said remote transmitting means relative to said line of sight between said remote transmitting means and said receiving means;
data input means mounted on said remote transmitting means and responsive to user input for providing a data signal which is related to a dedicated function;
encoding means coupled to said data input means and said plurality of transducers for encoding said data signal and applying said encoded signals to said plurality of transducers simultaneously;
said encoded data signal being said second portion of said signal; and
means for processing signals coupled to said receiving means for processing signals in response to said encoded data signals.

* * * * *